(12) United States Patent
Reddy

(10) Patent No.: US 9,203,442 B2
(45) Date of Patent: Dec. 1, 2015

(54) STATE METRICS BASED STOPPING CRITERION FOR TURBO-DECODING

(75) Inventor: Pallavi Reddy, Toulouse (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 144 days.

(21) Appl. No.: 14/004,846

(22) PCT Filed: Mar. 14, 2012

(86) PCT No.: PCT/EP2012/054497
§ 371 (c)(1),
(2), (4) Date: Oct. 28, 2013

(87) PCT Pub. No.: WO2012/123514
PCT Pub. Date: Sep. 20, 2012

(65) Prior Publication Data
US 2014/0049411 A1    Feb. 20, 2014

(30) Foreign Application Priority Data

Mar. 14, 2011    (EP) .................................... 11352003

(51) Int. Cl.
*H03M 13/29*    (2006.01)
*H03M 13/37*    (2006.01)
*H03M 13/53*    (2006.01)
*H03M 13/39*    (2006.01)

(52) U.S. Cl.
CPC ...... *H03M 13/3753* (2013.01); *H03M 13/2975* (2013.01); *H03M 13/3905* (2013.01); *H03M 13/3972* (2013.01)

(58) Field of Classification Search
CPC ..................... H03M 13/2975; H03M 13/3753; H03M 13/2714; H03M 13/2948; H03M 13/612; H03M 13/37; H03M 13/2957; H03M 13/296; H03M 13/3972; H03M 13/3723; H03M 13/3905; H03M 13/3955; H04L 1/0048; H04L 1/005; H04L 1/0055
See application file for complete search history.

(56) References Cited

U.S. PATENT DOCUMENTS

2009/0067554 A1 *  3/2009  Govindarajulu .............. 375/341
2011/0264979 A1 * 10/2011  Gunnam et al. .............. 714/752

OTHER PUBLICATIONS

Schlegel, C. B. et al., "Trellis and Turbo Coding", IEEE Press, Chapter 7.7, Chapter 10.7, Total pp. 392, XP002649770, (2002).
International Search Report Issued Apr. 25, 2012 in PCT/EP12/054497 Filed Mar. 14, 2012.

(Continued)

*Primary Examiner* — April Y Blair
*Assistant Examiner* — Dipakkumar Gandhi
(74) *Attorney, Agent, or Firm* — Oblon, McClelland, Maier & Neustadt, L.L.P.

(57) ABSTRACT

A stopping criterion for a turbo-encoding method. The criterion is based on a state metrics calculated by a forward-backward recursion in a coding trellis of an elementary encoder. If, for at least one elementary decoding stage, forward state metrics of a last symbol of a block or backward state metrics of a first symbol of a block exceeds a first threshold, the turbo-decoding iterations are stopped. If it is not the case, it is further checked whether the state metrics exceeds a second threshold and if the absolute value of the difference between the current state metrics and the state metrics obtained at the previous iteration lies below a given margin. In the affirmative, the turbo-decoding iterations are stopped and a hard decision is taken on extrinsic values.

9 Claims, 5 Drawing Sheets

(56) References Cited

OTHER PUBLICATIONS

Claude Berrou, et al. "Near Shannon Limit Error—Correcting Coding and Decoding: Turbo-Codes (1)" IEEE, Proceedings of ICC, vol. 93, 1993, pp. 1064-1070.

L.R. Bahl, et al., "Optimal Decoding of Linear Codes for Minimizing Symbol Error Rate" IEEE Transactions on Information Theory, Mar. 1974, pp. 284-287.

Hye-Mi Choi, et al., "Low-Power Hybrid Turbo Decoding Based on Reverse Calculation" ISCAS, 2006, pp. 2053-2056.

Zhongfeng Wang, et al., "On-Line Extraction of Soft Decoding Information and Applications in VLSI Turbo Decoding" IEEE Transactions on Circuits and Systems, vol. 49, No. 12, XP11071638, Dec. 2002, pp. 760-769.

Sun Minying, et al., "On the Fixed-Point Implementation of Turbo Code in 3G System" Proceedings of the Workshop on Personal Wireless Communications, XP009043427, Oct. 23, 2002, pp. 267-274.

\* cited by examiner

STATE METRICS BASED STOPPING CRITERION FOR TURBO-DECODING

TECHNICAL FIELD

The present application relates to the field of turbo codes and more particular to turbo-decoding.

PRIOR ART

The turbo-codes were introduced by C. Berrou et al. in the seminal article entitled "Near Shannon limit error-correcting coding and decoding: Turbo Codes", Proceedings of ICC' 93 pp. 1064-1070, have encountered since then widespread success. The remarkable performances of the turbo-codes in terms of bit error rate or BER (Bit Error Rate), close to those of random coding, are explained by the presence of one or more interleaver(s) between different elementary coders. They are used as error correcting codes in many digital communication standards.

In its most common form, a turbo-encoder can be regarded as a parallel or a serial concatenation of systematic elementary encoders separated by interleavers.

At the receiving side, turbo-decoding is achieved by an iterative process involving as many elementary decoders as the turbo-encoder has elementary encoders, each iteration improving the reliability of the decoded codeword.

FIG. 1 illustrates an example of the structure of a turbocoder comprising two parallel concatenated elementary recursive systematic convolutional (RSC) encoders.

In this example, a block of information bits, I, are coded by two elementary encoders of the systematic convolutional type, arranged in parallel. Each elementary encoder is constituted by a (shared) systematic path, leaving by definition the information bits unchanged, and by a convolutional encoder. The first convolutional encoder 110 outputs parity bits $P_1$ as a function of the information bits I. The block of parity bits is hereafter referred to as the first redundancy part. Similarly, the second convolutional encoder 120 outputs second parity bits $P_2$ as a function of the information bits I previously interleaved by the interleaver 130. The block of parity bits $P_2$ is referred to as the second redundancy part.

The multiplexer 150 multiplexes the information bits I (systematic part) with the parity bits $P_1$ (first redundancy part) and $P_2$ (second redundancy part) before transmission over the communication channel 160. More specifically, the multiplexed bits are converted into M-ary symbols (where M is the cardinal of the modulation alphabet) prior to carrier modulation.

FIG. 2 illustrates an example of turbo-decoder for decoding a block encoded by the turbo-encoder of FIG. 1.

The turbo-decoder comprises a first elementary decoder 210 corresponding to encoder 110, a second elementary decoder 220 corresponding to encoder 120. The decoders are of the SISO type (Soft In Soft Out) and may carry out the MAP (Maximum A posteriori Probability) decoding algorithm or one of its derivatives e.g. the Log-MAP or Max-Log-MAP decoding algorithm as known in the art.

The turbo-decoder receives from the symbol demodulator a noisy version of the information bits, the first parity bits and the second parity bits, respectively denoted $\tilde{I}$, $\tilde{P}_1$ and $\tilde{P}_2$. The systematic bits $\tilde{I}$ and first parity bits $\tilde{P}_1$ are supplied to the first elementary decoder 110. The first elementary decoder also inputs a priori information (also called extrinsic information) from the second elementary decoder.

Similarly, the second elementary decoder 220 inputs the received information bits $\tilde{I}$, after having being interleaved in interleaver 230, along with the received parity bits $\tilde{P}_2$. The second elementary decoder additionally inputs extrinsic information from the first elementary decoder after it has been interleaved in interleaver 230'. The interleavers 230 and 230' exhibit the same interleaving pattern $\Pi$ as interleaver 130. The extrinsic information provided by the second decoder is de-interleaved in de-interleaver 240 before being supplied to the first elementary decoder. The de-interleaver has the inverse interleaving pattern $\Pi^{-1}$ of interleaver 130.

The encoded block is subjected to iterative decoding, each decoding iteration comprising a first half-iteration in decoder 210 and a subsequent second half-iteration in decoder 220. The update and exchange of extrinsic information, i.e. of the extrinsic values relative to the different information bits, between the first and second elementary decoder, at each iteration, increases the reliability of the decoded block. It should be noted that the extrinsic information of the first decoder is initialized at values indicative of a lack of prior knowledge of bit reliability (0 if LLR values are used).

The extrinsic information is classically expressed in terms of soft values, e.g. LLRs (Log Likelihood Ratios) indicating the reliability of the decoding of each binary symbol. After completion of a given number of iterations or, more generally, when a predetermined stopping criterion is met, the decoding process is stopped and a hard decision is taken in 250 on the soft values to provide hard bit values. The hard decision is taken by performing a simple comparison with a given threshold (0 in case of LLR values).

The power consumption and the latency linearly depend upon the number of iterations of the decoder. It is therefore important to design an efficient stopping criterion, which does not lead to unnecessary iterations while simultaneously achieving a reasonable level of reliability of the decoded values.

Several stopping criteria have been proposed in the literature, based on soft and/or hard values.

US2007/0300139 discloses a stopping criterion based on the comparison of the LLR values output by an elementary decoder for two consecutive iterations. The implementation of such a stopping criterion requires however large storage capacity since a soft value (e.g. coded with a byte) has to be stored for each binary symbol of the block.

EP-A-1455457 further proposes to compare the minimum absolute value of the LLR values of an block with a given threshold. Once this minimum absolute value exceeds the threshold, the iterative decoding process is stopped. In other words, the decoding process stops when the reliability level of the less reliable bit is high enough.

In practice, this stopping criterion is quite sensitive to the threshold value. A too high threshold may result in a frequent rejection of correctly decoded blocks.

An alternative stopping criterion is based on the cross entropy of the LLR related to two consecutive iterations. This criterion is efficient but requires extra computation and considerable memory capacity.

Further stopping criteria are based on monitoring the sign changes in the extrinsic information related to two consecutive iterations. Indeed if a sign of a soft value oscillates from on iteration to the text, this indicates that the corresponding bit is not yet reliable. This stopping criterion requires considerable memory capacity, as the signs of the LLR values for at least two blocks of extrinsic information need to be stored.

The aim of the present invention is therefore to propose a new stopping criterion for a turbodecoding process, which is robust without needing computational overhead or large memory capacity.

DISCLOSURE OF THE INVENTION

The present invention is defined in the appended independent claims. Various advantageous embodiments are given in the dependent claims.

BRIEF DESCRIPTION OF THE DRAWINGS

The present invention will be better understood from the description of the following embodiments, by way of illustration and in no way limitative thereto.

DETAILED DISCLOSURE OF PARTICULAR EMBODIMENTS

We will consider again in the following a turbo-decoder for decoding blocks of binary symbols which have been encoded by a turbo-encoder. The term block can be construed here as a frame or a codeword. The binary symbols processed by the turbo-decoder are expressed in terms of soft values (soft information), typically in terms of LLRs as known in the art.

The turbo-encoder may be constituted by a plurality P of parallel or serially concatenated elementary encoders or a combination of such serial and parallel concatenated elementary encoders (hybrid turbo-encoder). Without loss of generality we will assume that the elementary encoders are RSC (Recursive Systematic Convolutional) encoders. It will nevertheless be understood by the man skilled in the art that other types of encoders can be used while remaining in the scope of present invention.

The turbo-decoder is constituted by the same plurality P of elementary decoders and performs an iterative decoding process as set out above. It is recalled that each elementary decoder corresponds to an elementary encoder of the turbo-encoder and processes the same kind of information as the one output by the corresponding elementary encoder. More specifically, each elementary decoder inputs the systematic part of the received block (e.g. after propagation over the communication channel), possibly interleaved, and a redundancy part corresponding to the one generated by said elementary encoder. In addition, the elementary decoder receives extrinsic information from at least another elementary decoder. Each elementary decoder generates its own extrinsic information from the input systematic part, redundancy part and extrinsic information. The extrinsic information thus generated is supplied in turn to at least another elementary decoder.

Before describing the operation of an elementary decoder, we first consider the corresponding elementary coder in the turbo-encoder. This elementary encoder, as any convolutional encoder, can be regarded as a finite state machine, the transitions of which are determined by the generator polynomial. If the memory of the encoder is of size v (v shift register stages), the finite state machine may take $2^v$ states, each state being defined by the contents of the memory. It should be noted that the various elementary encoders of the turbo-encoder may have different memory sizes (i.e. shift registers having different lengths) and hence different numbers of states.

Figure 1:
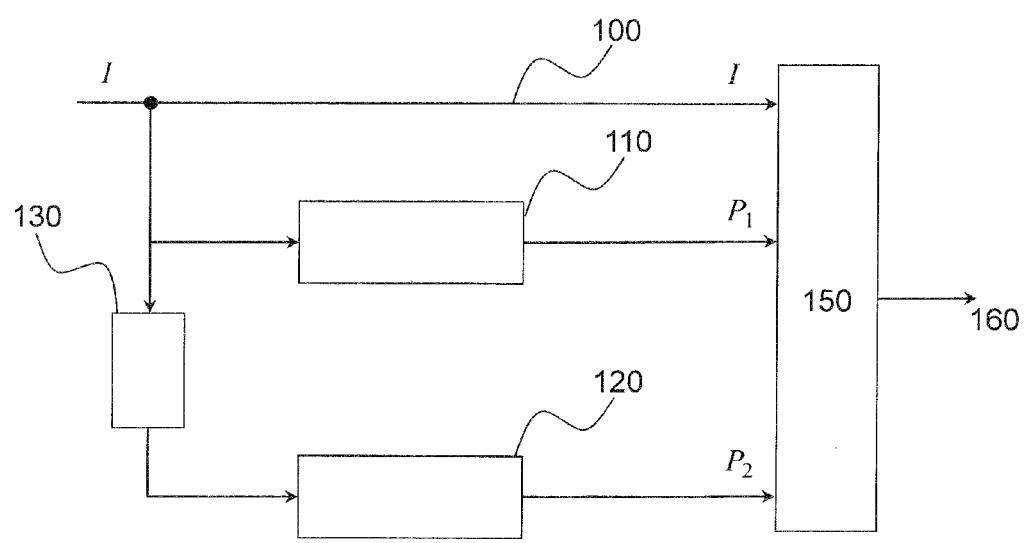
FIG. 1 schematically illustrates an example of turbo-encoder known from the prior art.
Figure 2:
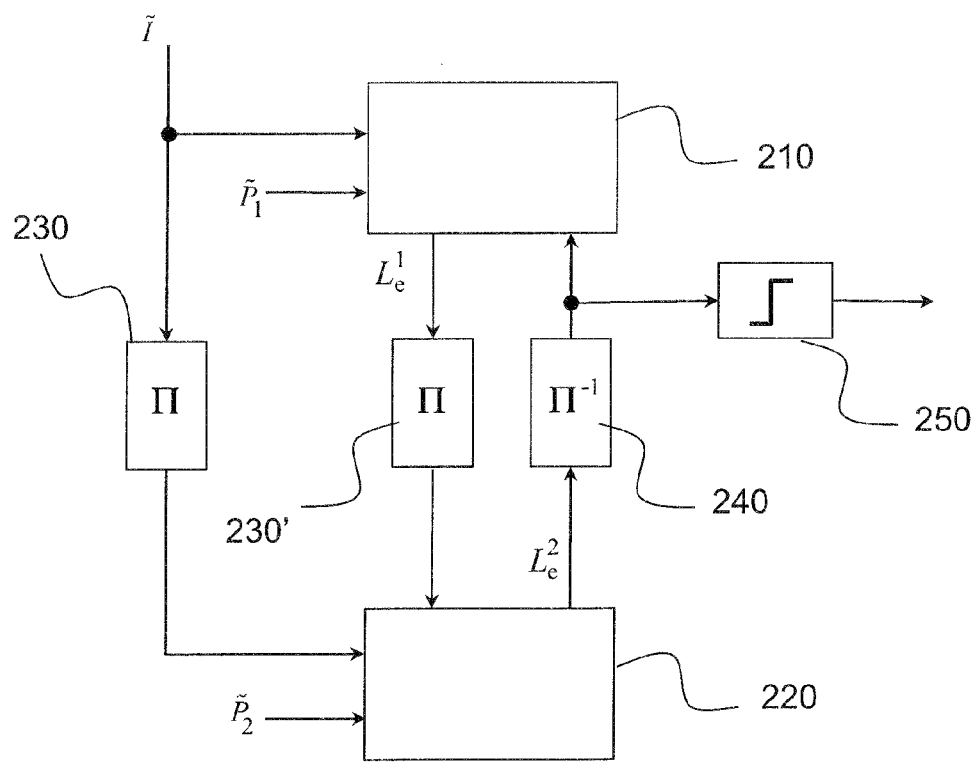
FIG. 2 schematically illustrates an example of turbo-decoder known from the prior art.
Figure 3:
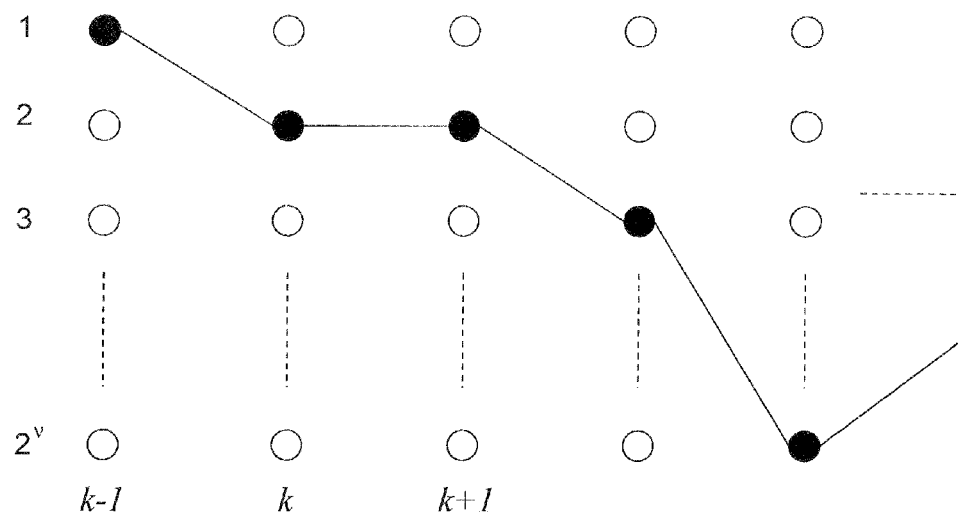
FIG. 3 schematically illustrates a coding path in the trellis diagram of an elementary encoder of the turbo-encoder.

The coding operation may be regarded as a coding path in a trellis diagram as represented in FIG. 3.

Conventionally, the states of the encoder are represented vertically by circles whereas the horizontal direction is the time axis. Each column of states corresponds to a clock cycle. At each input bit, on progresses rightwards (or forward) in the trellis, and the encoder goes from a state a time k to a subsequent state at time k+1. The transition between the state at time k and the state at time k+1 is therefore represented by an edge in the trellis (and by an arc in the state diagram). The coding of a block of bits results therefore in a path within the trellis. At each time k, the encoder outputs a parity bit (in addition to the systematic bit), which depends upon the state of the encoder and the input bit.

The corresponding elementary decoder implements a forward-backward algorithm as know in the art. By forward-backward algorithm we mean here the MAP decoding algorithm or one of its derivatives such as the Log-MAP or the Max-Log-MAP algorithm. A description of the MAP algorithm can be found in the original paper of Bahl et al. entitled "Optimal decoding of linear codes for minimizing symbol error rate" published in IEEE Trans. on Information Theory, pp. 284-287, March 1974. A description of the Max-Log-MAP algorithm can be found e.g. in the article of C. Hye-Mi et al. entitled "Low power hybrid turbo decoding based in reverse calculation, ISCAS 2006.

The forward-backward decoding algorithm is based on the same trellis as the coding trellis described above. More specifically, the forward-backward decoding algorithm mainly comprises three steps: a forward recursion, a backward recursion and an LLR calculation.

In the forward recursion, the algorithm recursively calculates the forward state probability of being in each state of the trellis at each time k given the knowledge of all the previous received symbols. The forward state probability, also called forward state metrics, is recursively obtained by:

$$\alpha_k(s) = \sum_{s'} \alpha_{k-1}(s')\gamma_k(s', s) \qquad (1)$$

$$k = 1, \ldots N - 1$$

where s is the current state and s' is the preceding state, $\alpha_{k-1}(s')$ is the forward state probability of being at state s' at time k−1, and $\gamma_k(s',s)$ is the branch probability of the transition between state s' and state s, given the received symbol, N is the size of the block. The state s' at the beginning of the transition s'→s will be referred to as the transition starting state whereas the state will be referred to as the transition ending state. The branch probability is also called the branch metrics.

The forward recursion is initialized by forcing the starting state to state 0 and setting:

$$\alpha_0(0)=1 \text{ and } \alpha_0(s)=0 \text{ for } s \neq 0 \qquad (2)$$

Figure 4:
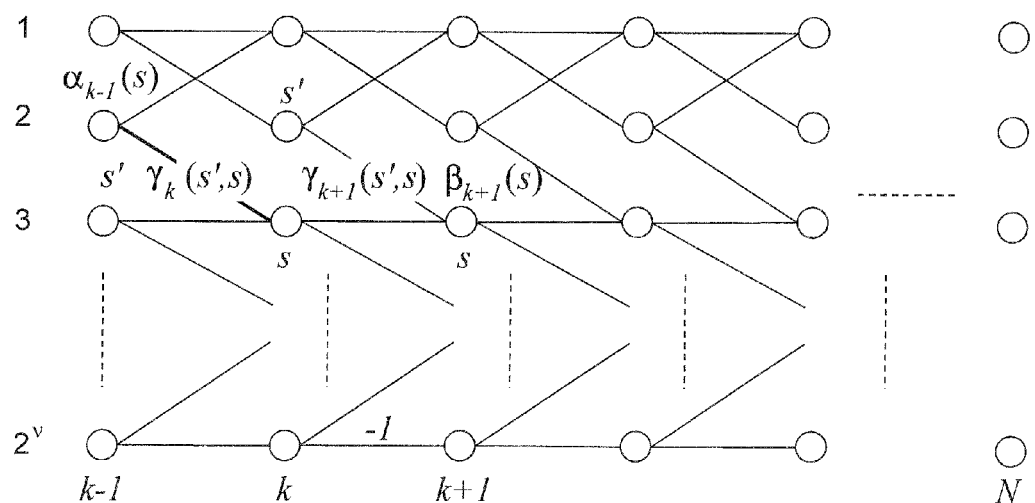
FIG. 4 schematically represents forward state metrics and backward state metrics used in the forward-backward decoding algorithm.

FIG. 4 schematically illustrates how the forward state metrics $\alpha_k(s)$ is calculated for a state s of the trellis. At time k, the forward state metrics of state s is calculated (by expression (1)) from the forward state metrics of the possible preceding states s' (in grey) at time k−1 (i.e. those corresponding to an authorized transition s'→s), $\alpha_{k-1}(s)$, and the transition metrics between states s and s', $\gamma_k(s',s)$.

Similarly, in the backward recursion, the algorithm recursively calculates the backward state probability of being in each state of the trellis at each time k given the knowledge of all the following symbols at time k+1. The backward state probability, also called backward state metrics, is recursively obtained by:

$$\beta_{k-1}(s') = \sum_s \beta_k(s)\gamma_k(s',s) \quad (3)$$

$$k = N, \ldots, 2$$

As illustrated in FIG. 4, the backward state metrics at time k is calculated from the backward state metrics of the possible following states s (nodes shaded in grey) at time k+1, $\beta_{k+1}(s)$, and the transition metrics between states s and s', $\gamma_{k+1}(s',s)$.

The backward recursion is initialized by forcing the ending state to state 0 and setting:

$$\beta_N(0)=1 \text{ and } \beta_N(s)=0 \text{ for } s\neq 0 \quad (4)$$

The output LLR for each bit $u_k$ at time k is given by:

$$L(u_k) = \ln\frac{P(u_k=+1\mid y_k)}{P(u_k=-1\mid y_k)} = \ln\frac{\sum_{(s',s)u_k=+1}\alpha_{k-1}(s')\gamma_k(s',s)\beta_k(s)}{\sum_{(s',s)u_k=-1}\alpha_{k-1}(s')\gamma_k(s',s)\beta_k(s)} \quad (5)$$

where $y_k$ is the modulation symbol received on the communication channel at time k and where the bit values have been noted ±1. The upper summation in (5) is carried out over all branches with input label +1 and the lower summation is carried out over all branches with input label −1.

For an AWGN (Additive White Gaussian Noise) channel, the branch metrics $\gamma_k(s,s')$ can be obtained as:

$$\gamma_k(s',s) = \exp\left(-\frac{\|y_k - x_k\|^2}{2\sigma^2}\right) \quad (6)$$

where $\sigma^2$ is the noise variance and $x_k$ is the expected symbol for the transition s' to s. Therefore, the $\gamma_k(s',s)$ values can be calculated at each turbo-decoding iteration.

The expressions (1)-(6) refer to the MAP algorithm. They can be simplified by using logarithmic values (Log-MAP algorithm) and even further simplified by retaining only the most significant values under the summation signs (Max-Log-MAP algorithm). In the latter case, denoting $\tilde{\rho}$ for ln ρ:

$$\tilde{\alpha}_k(s) = \max_{s'}\left[\tilde{\alpha}_{k-1}(s') + \tilde{\gamma}_k(s',s)\right] \quad (1')$$

$$\tilde{\alpha}_0(0) = 0 \quad (2')$$

and $$\tilde{\alpha}_0(s) = -\infty$$

for $s \neq 0$ $$\tilde{\beta}_{k-1}(s') = \max_{s'}\left[\tilde{\beta}_k(s) + \tilde{\gamma}_k(s',s)\right] \quad (3')$$

$$\tilde{\beta}_N(0) = 0 \quad (4')$$

and $$\tilde{\beta}_N(s) = -\infty$$

for $s \neq 0$ $$L(u_k) \max_{(s',s)u_k=+1}\left[\tilde{\alpha}_{k-1}(s') + \tilde{\gamma}_k(s',s) + \tilde{\beta}_k(s)\right] - \max_{(s',s)u_k=-1}\left[\tilde{\alpha}_{k-1}(s') + \tilde{\gamma}_k(s',s) + \tilde{\beta}_k(s)\right] \quad (5')$$

$$\tilde{\gamma}_k(s',s) = -\frac{1}{2\sigma^2}[\|y_k\|^2 + \|x_k\|^2] + \frac{1}{\sigma^2}(y_k \cdot x_k) \quad (6')$$

As the first term between brackets is common to all branch metrics, it can be dropped for the purpose of calculating (1'), (3') and (5'), in other words:

$$\tilde{\gamma}_k(s',s) = \frac{1}{\sigma^2}(y_k, x_k) \quad (6'')$$

In expressions (6) or (6''), the only changing parameter is $x_k$. $x_k$ is a P+1 dimension vector (assuming one parity bit per elementary coder), the elements of which are the systematic bit, denoted $x_k^s$ and the parity bits denoted $x_k^{r_p}$, p=1, ..., P. The soft value of the systematic bit in (6) or (6'') is replaced by:

$$x_k^s = y_k^s + L_e(u_k) \quad (7)$$

where $L_e(u_k)$ is the extrinsic information provided from another elementary decoder. Therefore, the $\gamma_k(s',s)$ values can be calculated at each turbo-decoding iteration.

The forward state metrics of the last symbol of the block can be regarded as a cumulated metrics along the expected coding path in trellis, when travelled through in the forward direction. Similarly, the backward state metrics of the first symbol can be regarded as a cumulated metrics along the expected coding path in the trellis, when travelled through in the backward direction.

In general, the state metrics (either forward or backward) increases along the travelled path. For example, if the Max-Log-MAP algorithm is used, the forward state metrics increases between the first symbol and the last symbol from 0 to the cumulated value:

$$\tilde{\alpha}_N(s) = \max_{s'}\left(\sum_{k=1}^N \tilde{\gamma}_k(s',s)\right) \quad (8)$$

and, similarly, the backward state metrics increases between the last symbol and the first symbol from 0 to the same cumulated value:

$$\tilde{\beta}_0(s) = \max_{s'}\left(\sum_{k=1}^N \tilde{\gamma}_k(s',s)\right) \quad (9)$$

This cumulated value reflects the likelihood of the considered coding path. In the remaining part of the description, it should be understood that the coding path referred to is the one exhibiting the highest likelihood.

Figure 5A:
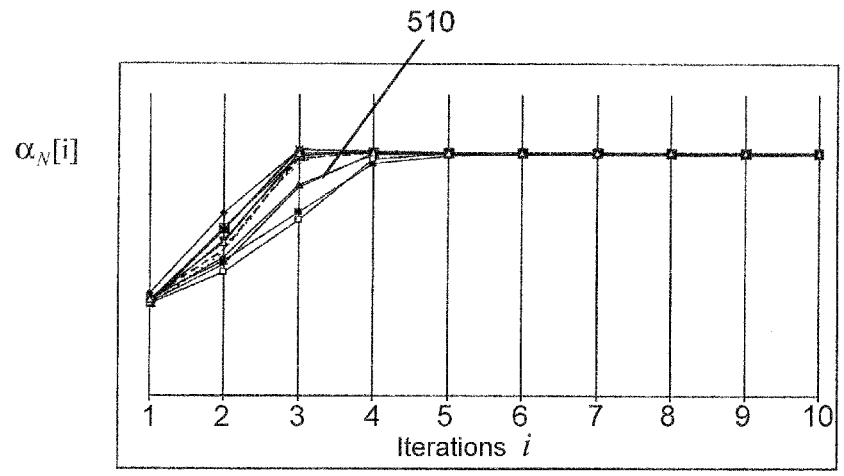
FIG. 5A illustrates the evolution of the forward state metrics of the last block symbol for consecutive turbo-decoding iterations.

FIG. 5A represents the cumulated value $\alpha_N[i]$ of the forward state metrics of the considered coding path, for a plurality of consecutive iterations i. The curves 510 correspond to different blocks of symbols and a SNR value of 1.1 dB.

It should be noticed that the forward state metrics saturates after 4 or 5 iterations. In other words, the cumulated value of the forward state metrics is a good indicator of the convergence of the turbo-decoding. Similarly, the backward state metrics saturates after a few iterations and is therefore an equivalent indicator of convergence.

Figure 5B:
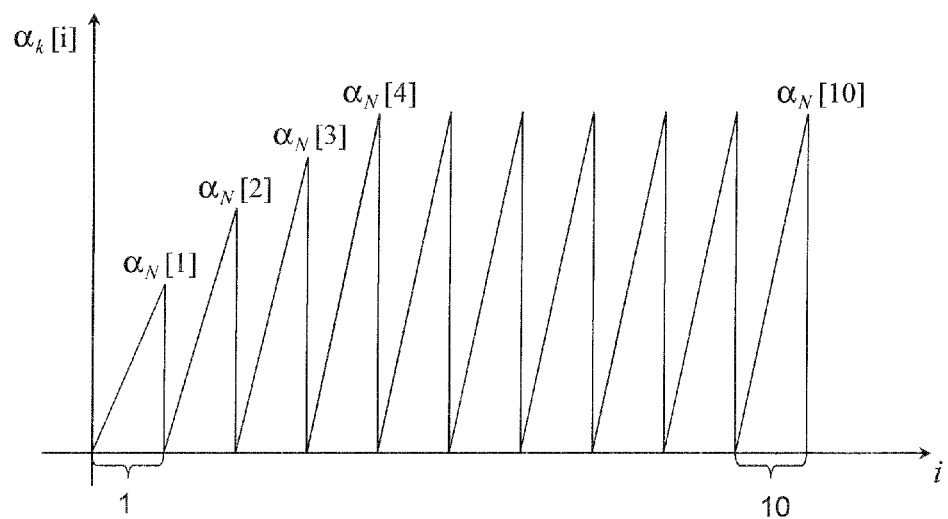
FIG. 5B illustrates the evolution of the state metrics for the various symbols of the block and consecutive turbo-decoding iterations.

FIG. 5B illustrates the variation of the forward state metrics $\alpha_k[i]$ add along the considered coding path, k=0, ..., N for consecutive turbo-decoding iterations.

For each iteration, the forward state metrics ramps up from the first symbol to the last ($N^{th}$) symbol of the block. As already noticed in FIG. 6, the cumulated value, $\alpha_N$, reached at the $N^{th}$ symbol of the block, increases as the turbo-decoding proceeds and then saturates after a few iterations.

A first stopping criterion according to the present invention consists in comparing the cumulated value of the forward state metrics (resp. the backward state metrics) with a predetermined threshold $\alpha_{th}$ (resp. $\beta_{th}$). This threshold, hereinafter referred to as first threshold, can be tuned by simulation to the block length and the expected SNR (Signal to Noise Ratio). If the cumulated value at iteration i is greater than said threshold, i.e. if:

$$\alpha_N[i] > \alpha_{th} (\text{resp. } \beta_N[i] > \beta_{th}) \quad (10)$$

the turbo-decoding iterations are stopped.

A second stopping criterion can be combined with the first in order to enhance its robustness. More specifically, if the cumulated value of the forward state metrics (resp. backward state metrics) does not meet the first stopping criterion, it is checked whether a second stopping criterion:

$$\alpha_N[i] > \alpha'_{th} \text{ and } |\alpha_N[i] - \alpha_N[i-1]| < \Delta_\alpha \quad (11)$$

(resp. $\beta_N[i] > \beta'_{th}$ and $|\beta_N[i] - \beta_N[i-1]| < \Delta_\beta$) is met, where $\alpha'_{th}$ (resp. $\beta'_{th}$) is a second threshold and $\Delta_\alpha$ (resp. $\Delta_\beta$) is a margin. In the affirmative, the turbo-decoding iterations are stopped. The second criterion (11) expresses the saturation of the state metrics at a sufficient high level. Typically, the second threshold is lower than the first threshold.

Figure 6:
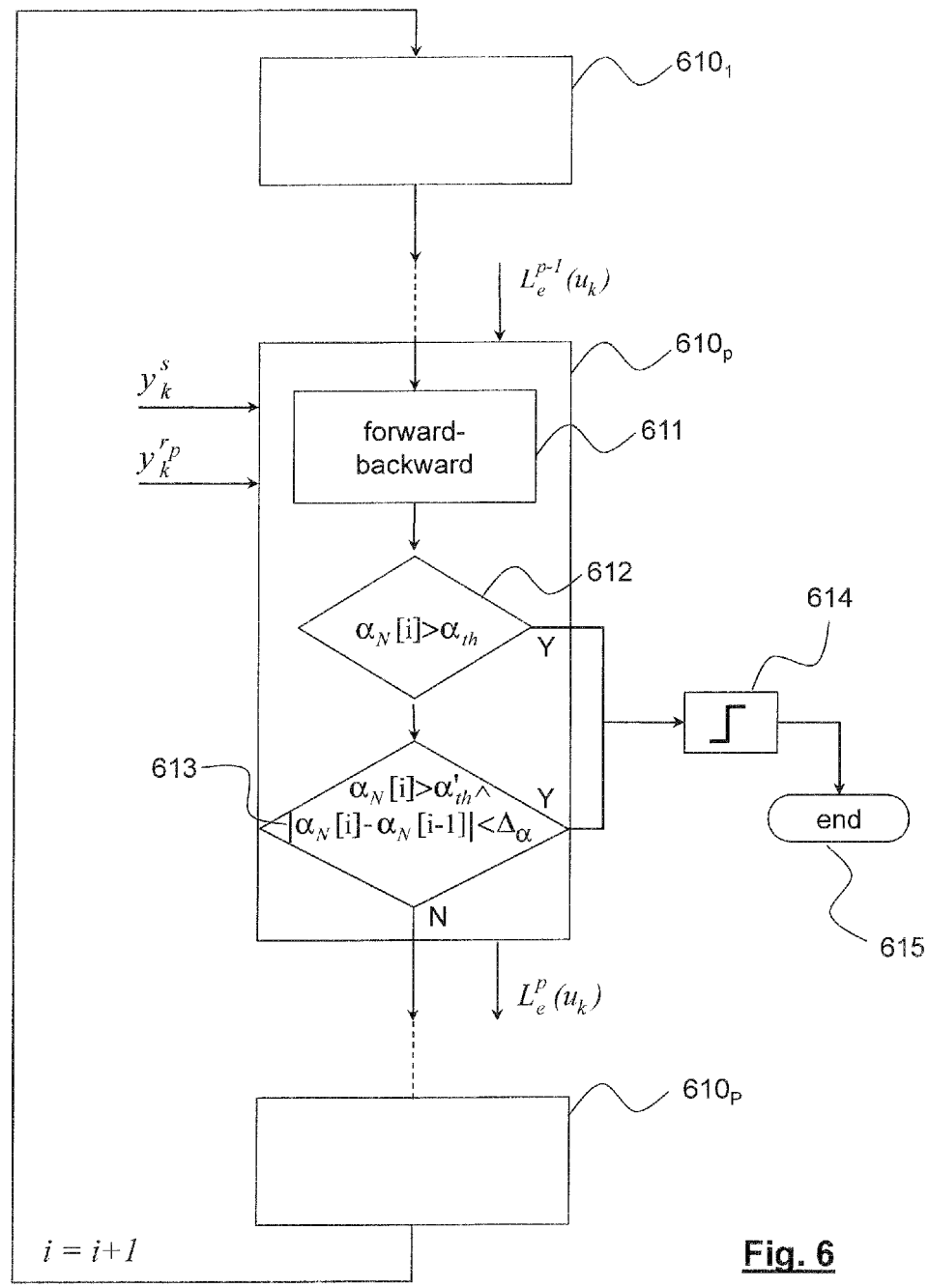
FIG. 6 schematically represents a flowchart of a turbo-decoding method using a stopping criterion according to an embodiment of the invention.

FIG. 6 represents a flowchart of a turbo-decoding method using a stopping criterion according to an embodiment of the invention.

As already mentioned in the outset, the turbo-decoding method consists in a plurality of iterations, each iteration being subdivided into P decoding stages, $610_1, \ldots, 610_P$ sequentially performed by the P elementary decoders.

The stopping criterion is implemented here in the $p^{th}$ decoder. More generally, it is implemented in at least one elementary decoder.

The $p^{th}$ decoder receives the systematic soft bits $y_k^s$ and the soft parity bits $y_k^{r_p}$ from the demodulator. It also inputs the extrinsic values $L_e^{p-1}(u_k)$ from the preceding decoder.

We consider here the $i^{th}$ turbo-decoding iteration. The decoding stage $610_p$ starts with a forward-backward recursion in 611. The forward-backward algorithm can be the MAP, Log-MAP or Max-Log-MAP decoding algorithm.

The state metrics of the last symbol of the block (forward state metrics) or the first symbol of the block (backward state metrics) is calculated at the end of the forward-backward recursion 611 and the first stopping criterion is checked in 612.

If the state metrics exceeds the first threshold (expression (10)), the turbo-encoding exits and a hard decision is taken in 614 on the extrinsic values just obtained from the forward-backward recursion.

In the negative, the second stopping criterion is checked in 613. If the state metrics exceeds the second threshold and if the absolute value of the difference of state metrics between the current iteration and the previous one lies below a predetermined margin, the turbo-encoding exits and a hard decision on the extrinsic values is taken in 614. The turbo-decoding then ends at 615.

Conversely, if neither the first nor the second stopping criterion is met, the iteration proceeds with the next decoding stage $610_{p+1}$.

According to a variant (not shown), the first stopping criterion can be implemented alone. However for increased robustness to SNR, the combination of the first and second criteria is preferred.

It will also be understood by the man skilled in the art that the implementation of the first stopping criterion does not require any storage in a memory (no state metrics is stored) and can be checked on the fly with very little additional overhead.

The invention claimed is:

1. A turbo-decoding method for turbo-decoding a block of symbols having been coded by a turbo-encoder, the turbo-decoding comprising:
    a plurality of iterations, each iteration comprising a plurality of decoding stages, each decoding stage being carried out by an elementary decoder corresponding to an elementary encoder of the turbo-encoder, each decoding stage performing a forward-backward recursion on a coding trellis of the corresponding encoder, the trellis representing various states of the encoder for each symbol of the block;
    wherein a forward state metrics of the last symbol or a backward state metrics of the first symbol of the block is calculated;
    wherein the state metrics is compared with a first predetermined threshold; and
    wherein if the state metrics exceeds the first predetermined threshold, the iterations are stopped.

2. The turbo-decoding method according to claim 1, wherein if the state metrics does not exceed the first predetermined threshold, it is checked (a) whether the state metrics exceeds a second predetermined threshold; and (b) if the absolute value of the difference between the state metrics and the state metrics of a previous iteration lies below than a predetermined margin, and if both conditions and are met, the iterations are stopped.

3. The turbo-decoding method according to claim 2, wherein the second threshold is lower that the first threshold.

4. The turbo-decoding method according to claim 2, wherein each decoding stage supplies extrinsic values of systematic bits to a next decoding stage and a last decoding stage supplies extrinsic values of the systematic bits to a first decoding stage.

5. The turbo-decoding method according to claim 4, wherein if the state metrics exceeds the first threshold, a hard decision is taken on the extrinsic values supplied by the at least one decoding stage to provide hard decided systematic bits.

6. The turbo-decoding method according to claim 4, wherein if conditions (a) and (b) are met, a hard decision is taken on the extrinsic values supplied by the at least one decoding stage to provide hard decided systematic bits.

7. The turbo-decoding method according to claim 1, wherein the forward-backward recursion is performed according to a MAP decoding algorithm.

8. The turbo-decoding method according to claim 1, wherein the forward-backward recursion is performed according to a Log-MAP decoding algorithm.

9. The turbo-decoding method according to claim 1, wherein the forward-backward recursion is performed according to a Max-Log-MAP decoding algorithm.

* * * * *